United States Patent [19]
Capasso et al.

[11] Patent Number: 5,570,386
[45] Date of Patent: Oct. 29, 1996

[54] SEMICONDUCTOR LASER

[75] Inventors: Federico Capasso, Westfield; Alfred Y. Cho, Summit; Jerome Faist, Scotch Plains; Albert L. Hutchinson, Piscataway; Carlo Sirtori, Summit; Deborah L. Sivco, Warren, all of N.J.

[73] Assignee: Lucent Technologies Inc., Murray Hill, N.J.

[21] Appl. No.: 509,409

[22] Filed: Jul. 31, 1995

Related U.S. Application Data

[63] Continuation-in-part of Ser. No. 223,341, Apr. 4, 1994, Pat. No. 5,457,709.

[51] Int. Cl.$^6$ ...................................................... H01S 3/19
[52] U.S. Cl. .............................. 372/46; 372/45
[58] Field of Search ................................ 372/45, 46, 43, 372/44

[56] References Cited

U.S. PATENT DOCUMENTS

| | | | |
|---|---|---|---|
| 5,400,352 | 3/1995 | Lebby et al. | 372/45 |
| 5,457,709 | 10/1995 | Capasso et al. | 372/45 |

OTHER PUBLICATIONS

"Possibility of the Amplification of Electromagnetic Waves in a Semiconductor with a Superlattice", by R. F. Kazarinov et al., *Soviet Physics–Semiconductors*, vol. 5, No. 4, Oct., 1971, pp. 707–709.

"Evaluation of the Feasibility of a Far–infrared Laser Based on Intersubband Transitions in GaAs Quantum Wells", by S. I. Borenstain et al., *Applied Physics Letters*, vol. 55 (7), 14 Aug. 1989, pp. 654–656.

"Feasibility of Far–infrared Laser Using Multiple Semiconductor Quantum Wells", by Q. Hu, *Applied Physics Letters*, vol. 59 (23), 2 Dec. 1991, pp. 2923–2925.

"Possibility of Infrared Laser in a Resonant Tunneling Structure", by A. Kastalsky et al., *Applied Physics Letters*, vol. 59 (21), 18 Nov. 1991, pp. 2636–2639.

"Carrier Transport and Intersubband Population Inversion in Coupled Quantum Wells", by W. M. Yee et al., *Applied Physics Letters*, vol. 63 (8), 23 Aug. 1993, pp 1080–1091.

"Periodic Negative Conductance by Sequential Resonant Tunneling Through an Expanding High–field Superlattice Domain", by K. K. Choi et al., *Physical Review B*, vol. 35, No. 8, 15 Mar. 1987–I, pp. 4172–4175.

"Band Nonparabolicity Effects in Semiconductor Quantum Wells", by D. F. Nelson et al., *Physical Review B*, vol. 35, No. 14, 15 May 1987, pp. 7770–7773.

"Quantum–well Intersub–band Electroluminescent Diode at $\lambda=5\mu m$", by J. Faist, *Electronics Letters*, 9th Dec. 1993, vol. 29, No. 25, pp. 2230–2231.

"Phonon Limited Intersubband Lifetimes and Linewidths in a Two–dimensional Electron Gas", by J. Faist et al., *Applied Physics Letters*, vol. 64 (7), 14 Feb. 1994, pp. 872–874.

"Pseudo–quaternary GaInAsP Semiconductors: a New $Ga_{0.47}In_{0.53}As/InP$ Graded Gap Superlattice and its Applications to Avalanche Photodiodes", by F. Capasso et al., *Applied Physics Letters*, vol. 45 (11), 1 Dec. 1984, pp. 1193–1195.

"Staircase Solid–State Photomultipliers and Avalanche Photodiodes with Enhanced Ionization Rates Ratio", by F. Capasso et al., *IEEE Transactions on Electron Devices*, vol. ED–30, No. 4, Apr. 1983, pp. 381–390.

"Mid–infrared Field–tunable Intersubband Electroluminescence at Room Temperature by Photon–assisted Tunneling in Coupled–quantum Wells", by J. Faist et al., *Applied Physics Letters*, vol. 64 (9), 28 Feb. 1994, pp. 1144–1146.

*Primary Examiner*—James W. Davie
*Attorney, Agent, or Firm*—Eugen E. Pacher

[57] ABSTRACT

The disclosed unipolar quantum cascade (QC) laser comprises a multiplicity of essentially identical active regions, with adjacent active regions separated by a superlattice carrier injection/relaxation region. A given active region contains a single quantum well with at least two electron states. Lasing is obtained without global intersubband population inversion. Instead, there is believed to exist local population inversion in a small region of k-space near k=0, corresponding to electron energies approximately within an optical phonon energy (~35 meV) from the bottom of the lower subband. A novel design feature that can be used to improve the thermal characteristics of substantially any QC laser is also disclosed.

10 Claims, 7 Drawing Sheets

SEMICONDUCTOR LASER

CROSS-REFERENCE TO RELATED APPLICATION

This application is a continuation-in-part of our application, Ser. No. 08/223,341, filed Apr. 4, 1994 by F. Capasso et al U.S. Pat. No. 5,457,709.

FIELD OF THE INVENTION

This application pertains to the field of injection semiconductor lasers.

BACKGROUND OF THE INVENTION

R. F. Kazarinov et al. (*Soviet Physics-Semiconductors*, Vol. 5(4), p. 707 (1971)) predicted the possibility of amplification of electromagnetic waves in a semiconductor superlattice structure. Since the publication of this seminal paper, the feasibility of a unipolar quantum well semiconductor laser has been considered by many workers in the field. See, for instance, S. J. Borenstain et al., *Applied Physics Letters*, Vol. 55(7), p. 654 (1989); Q. Hu et al., *Applied Physics Letters*, Vol. 59(23), p.2923 (1991); A. Kastalsky et al., *Applied Physics Letters*, Vol. 59(21), p. 2636 (1991); and W. M. Yee et al., *Applied Physics Letters*, Vol. 63(8), p. 1089 (1993). However, to the best of our knowledge, the prior art does not disclose observation of lasing in any of the proposed unipolar structures.

Those skilled in the art are aware of the advantages potentially offered by some types of unipolar injection laser. Among these are a frequency response that is not limited by electron/hole recombination, a narrow emission line because the line-width enhancement factor is (theoretically) zero, and a weaker temperature dependence of the lasing threshold than in conventional (i.e., bipolar) semiconductor lasers. Furthermore, appropriately designed unipolar semiconductor lasers can have an emission wavelength in the spectral region from the mid-infrared (mid-IR) to the submillimeter region, exemplarily in the approximate range 3–100 µm, that is entirely determined by quantum confinement. The emission wavelength can be tailored using the same heterostructure material over the above mentioned wide spectral region, a portion of the spectrum not easily accessible with diode semiconductor lasers. Furthermore, unipolar lasers can use relatively wide bandgap, technologically mature materials (e.g., utilize GaAs- or InP-based heterostructures), without reliance on temperature sensitive and difficult to process small bandgap semiconductors such as PbSnTe. Such unipolar lasers could, for instance, be advantageously used for pollution monitoring, industrial process control and automotive applications.

Prior art proposals for unipolar quantum well semiconductor lasers typically involve use of resonant tunneling structures. For instance, W. M. Yee et al., (op. cit.) analyzed two coupled quantum well structures, each of which contains an emission quantum well sandwiched between energy filter wells, the coupled quantum well assembly sandwiched between n-doped injector/collector regions. The energy filter wells, respectively, have only one quasibound state ($E_1$ and $E_3$, respectively), and the emission quantum well has more than one quasibound state, with intersubband transitions taking place between two of the states ($E_2^{(2)}$ and $E_2^{(1)}$). When, by means of a applied electric field, $E_1$ becomes substantially aligned with $E_2^{(2)}$, electrons from the injector can resonantly populate $E_2^{(2)}$. If, at the same applied field, $E_3$ is substantially aligned with $E_2^{(1)}$ then the latter can be resonantly depleted into the collector. If the time constant for the former process is longer than the time constant for the latter then a population inversion in the emission quantum well could, at least in principle, be achieved.

As those skilled in the art will appreciate, the optical output power obtainable from a structure of the type analyzed by Yee et al., (i.e., a structure that comprises a single set of coupled quantum wells) is typically too small to be of practical interest. In principle this shortcoming can be remedied by provision of a structure that comprises a multiplicity of said sets. However, it is known that, for fundamental reasons, lasing typically cannot be achieved in such a structure. For instance, application of a voltage across such a multi-quantum well structure that comprises doped regions will typically result in a non-uniform field in the device, with attendant negative resistance and instability. See, for instance, K. K. Choi et al., *Physical Review B.*, Vol. 35 (8), p. 4172 (1987).

In view of the considerable potential commercial and scientific value of a unipolar semiconductor laser, especially one that can be designed to emit in the mid-IR spectral region, such a laser would be of substantial interest. This application discloses such a laser, to be referred to as the quantum cascade (QC) laser.

SUMMARY OF THE INVENTION

In a broad aspect this application discloses a unipolar semiconductor injection laser. More specifically, the instant invention is embodied in an article that comprises a unipolar semiconductor (typically III-V semiconductor) laser that comprises a multiplayer semiconductor structure containing doped semiconductor material of only a first conductivity type (typically n-type), and means for applying a voltage (including a normal operating voltage) across said multilayer semiconductor structure.

Significantly, the multilayer structure comprises a multiplicity (e.g., ten or more) of essentially identical (i.e., exhibiting at most only substantially unavoidable minor differences) "active" regions, a given one of said active regions being separated from an adjoining active region by an "energy relaxation" region. In one embodiment, each of said active regions comprises two or more coupled quantum wells. Associated with said at least two coupled quantum wells are at least two (but preferably three or more) energy states, said at least two (or three) energy states to be referred to, respectively, as third and second (or third, second and first) energy states. The third energy state is at a higher energy than the second energy state, which in turn is (under appropriate bias) at a higher energy than the first energy state. The third, second and first energy states will also be referred to as the n=3,2 and 1 states, respectively. Associated with said first, second and third energy states are, respectively, first, second and third wavefunctions. A wavefunction is "associated" with an energy state in a well if the centroid of the modulus square of the wavefunction is located in the well.

An important aspect of some embodiments of the QC laser is selection of the active region such that there is provided reduced spatial overlap between said third and second wavefunctions in a given active region. By "reduced spatial overlap" we mean herein overlap that is less than the overlap between the wavefunctions of states $E_2^{(2)}$ and $E_2^{(1)}$ of QW2 of any of the two structures of FIG. 1 of W. M. Yee et al., *Applied Physics Letters*, Vol. 63(8), p. 1089. Techniques for computing the overlap between wavefunctions in quantum well structures are known to those skilled in the art and do not require exposition. See, for instance, G. Bastard, "Wave Mechanics Applied to Heterostructures", Les Editions de Physique, Paris 1990, incorporated herein by reference. See also D. F. Nelson et al., *Physical Review B*, Vol. 35 (14), p. 7770 (1987). At least some (desirably substantially all) of the charge carriers undergo a radiative transition from the third to the second energy state.

In some embodiments the energy relaxation regions are selected to be thick enough to provide substantial energy relaxation and randomization of motion of charge carriers of the given conductivity type in a given graded energy relaxation region when a normal operating voltage is applied. Differently stated, and with reference to FIG. 1, the thickness of a given energy relaxation layer 12 is selected to facilitate relaxation of charge carriers from the energy of the n=1 energy state 119 to the energy of the n=3 energy state 122 of the next active region, such that the carriers can tunnel into the n=3 state 122 of the next active layer. Exemplarily, the thickness is $1-2\lambda_E$, where $\lambda_E$ is the energy mean free path of the carriers in the energy relaxation region. At least some of the charge carriers are introduced into the given energy relaxation region by tunneling from said first energy state through a barrier layer. Typically, the active regions are at most lightly doped (exemplarily less than about $2-3 \times 10^{16} cm^{-3}$) and preferably undoped (not intentionally doped), and the graded gap regions are doped (desirably not greatly exceeding about $10^{17} cm^{-3}$, to minimize free carrier absorption) to exhibit conductivity of the given type, typically n-type. The energy relaxation region can be continuously (analog) or stepwise graded, but in currently preferred embodiments is digitally graded.

A further significant aspect of the layer structure is the provision of optical confinement of the lasing mode. This is accomplished by appropriate selection of layer compositions to result in a waveguide core of higher effective refractive index than that of the cladding layers.

As will be described in more detail below, the reduced overlap in some embodiments between the third and second energy states in preferred embodiments materially contributes to attainment of a relatively long lifetime ($\tau_{32}$) of the charge carriers in the third energy state. (The carriers are provided to the third energy state by tunneling from a first adjoining energy relaxation region). The lasing-relevant transition is the photon-emitting transition from the third to the second energy state. Carriers typically are removed from the second energy state by tunneling or phonon scattering into the first energy state. Associated with the carriers in the second energy state is a lifetime $\tau_{21}$, which must be less than $\tau_{32}$, to achieve population inversion between energy levels 3 and 2. Lifetime $\tau_{32}$ can be made relatively large by appropriate choice of the wavefunction overlap, and $\tau_{21}$ can be made relatively small by, e.g., provision of an appropriately thin (e.g., less than 10 or 5 nm) barrier between the quantum wells associated with said first and second energy states. Preferably the active region is formed such that, with a normal operating voltage applied, the energy difference $\Delta E_{21}$ between second and first energy states is about $h\upsilon_{op}$ or larger, where h is Planck's constant and $\upsilon_{op}$ is the relevant optical phonon frequency. The preferred layer structure is also designed to provide, under a normal operating voltage, for tunneling of the carriers from the well associated with the first energy state into a second adjoining graded gap region.

The provision of energy relaxation regions is a significant aspect of the described embodiment of the invention, since it inter alia makes possible lasing in the multi-period structure before the appearance of negative resistance, thereby overcoming a significant shortcoming of previously proposed unipolar laser structures. The provision of reduced overlap of the third and second wavefunctions makes possible attainment of larger values of $\tau_{32}$ than are typically attainable in prior art structures, and is another significant aspect of some embodiments.

A still further significant aspect is the substantial absence of dopant from the active regions of the QC laser, facilitating narrowing of the luminescence spectrum, thereby increasing the peak gain. The absence of doping is to be compared with the structure disclosed by J. Faist et al., (*Electronics Letters*, Vol. 29 (25), p. 2230 (Dec. 1993)) wherein, in addition to the graded gap region, a portion of the active region is doped. The structure exhibited a broad luminescence peak and was not capable of lasing, due to the absence of waveguiding layers and the doping of a portion of the active region.

Our further study of the physics of QC lasers has lead to the surprising discovery that the presence of two (or possibly more) quantum wells (QWs) in each of the multiplicity of active regions is not an essential requirement, and that a QC laser with a single QW in each of a multiplicity of active regions is feasible. Such a "single QW" laser was made, and lased at the design wavelength of about 4.5 µm.

DETAILED DESCRIPTION OF SOME PREFERRED EMBODIMENTS

Among the difficulties that have to be overcome before a practical unipolar laser can be achieved is the following: In III-V semiconductor materials of current interest, the excited state (e.g., $E_2^{(2)}$ of FIG. 1 of Yee et al.) non-radiative lifetime ($\tau_{NR}$) typically is quite small (exemplarily about 1 ps), if the intersubband separation (e.g., $E_2^{(2)}-E_2^{(1)}$ of FIG. 1 of Yee et al.) corresponds to a wavelength less than about 40 µm. This is typically due to the possibility in these materials of non-radiative decay due to optical phonon emission, for $E_2^{(2)}-E_2^{(1)} \geq h\upsilon_{op}$, the optical phonon energy (typically about 30 meV). For $E_2^{(2)}-E_2^{(1)} < h\upsilon_{op}$, $\tau_{NR}$ is much larger, typically a few hundred picoseconds, being limited primarily by acoustic phonon scattering. J. Faist et al., *Applied Physics Letters*, Vol. 64(7), p. 872, (Feb. 1994). The following portion of this specification deals with multi-QW QC lasers. This is followed by a portion that deals with single-QW QC lasers.

Those skilled in the art will appreciate that a unipolar laser requires design features that make it possible to increase the excited state lifetime to a value substantially greater than is associated with prior art structures, such that a significant population inversion can be attained for transition energies $\geq h\upsilon_{op}$. Exemplarily this is achieved by means of spatial separation between the ground state and the first excited state, with the relevant quantum wells being asymmetric and strongly coupled.

Figure 1:
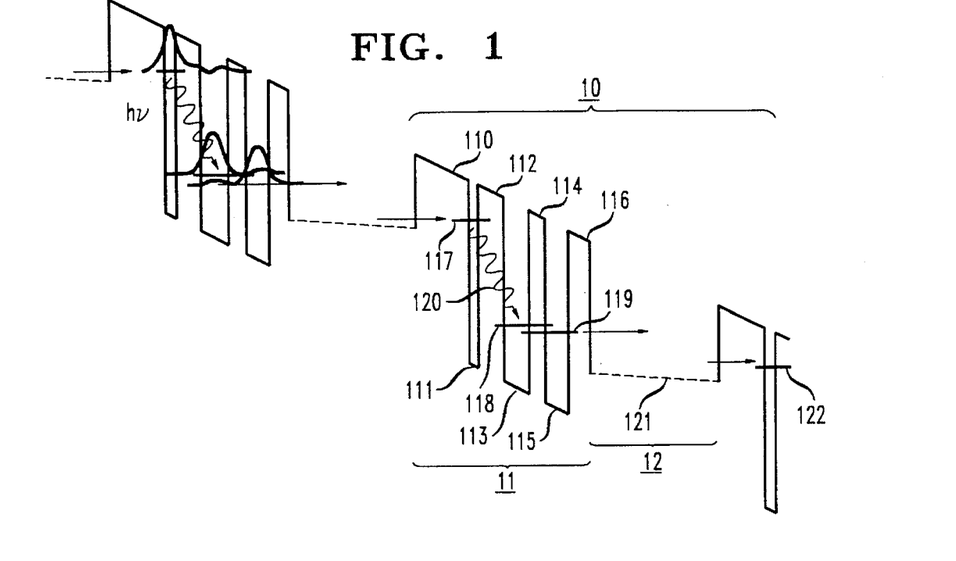
FIG. 1 schematically depicts a portion of the conduction band diagram of an exemplary laser according to the invention.

FIG. 1 schematically depicts the conduction band diagram of a portion of the multilayer semiconductor structure of an exemplary unipolar laser according to the invention under positive bias conditions corresponding to an electric field of $10^5$V/cm. The quantum wells exemplarily are $Ga_{0.47}In_{0.53}As$ (to be referred to as "GaInAs"), and the barriers are $Al_{0.48}In_{0.52}As$ ("AlInAs"). The depicted portion comprises one period 10 of a (multiperiod) multilayer semiconductor structure, with the two adjoining periods also indicated. Each period comprises an active region 11 and an energy relaxation region 12, the former being substantially undoped (typically not intentionally doped), ad the latter being doped. The energy relaxation region exemplarily is a digitally graded gap region. However, other energy relaxation regions are possible.

Electronis are tunnel injected into active region 11 through barrier 110. The active region includes coupled asymmetric quantum wells 111 and 113, separated by barrier 112. Associated with wells 111 and 113 are third energy state 117 and second energy state 118, respectively. Wavy line 120 indicates the photon-assisted tunneling transition responsible for luminescence (and lasing) in the exemplary structure. Electrons in the second energy state tunnel through barrier 114 into quantum well 115, occupying therein first energy state 119. Furthermore, electrons tunnel through barrier 116 from well 115 into energy relaxation region 12. One of the adjoining active regions shown in FIG. 1 depicts the modulus square of the wavefunction associated with the first, second and third energy states, respectively.

As can be seen from FIG. 1, the wavefunction of the n=3 state can extend into the neighboring quantum well (e.g., 113) and beyond, possibly resulting in some "leakage" of electrons out of the n=3 state. This occurs because the QC laser typically operates under a strong applied electric field. The main effect of the extension of the wavefunction into the continuum typically is a decrease of the injection efficiency, as electrons are escaping into the continuum instead of making a radiative transition. We believe that such escape can be reduced or prevented by appropriate choice of layer thicknesses, such that the layers form a Bragg reflector for the n=3 carriers (exemplarily electrons).

More specifically, it is possible to design, at least if the energy relaxation region is a digitally graded gap region, the energy relaxation region so as to behave as a Bragg mirror for the electrons at the energy of the n=3 level. Provision of an appropriately designed Bragg mirror can result in reflection of electrons back into the n=3 level, and thus prevent their escape into the continuum. Exemplarily, such Bragg reflection can be achieved if $$l_{w,j}k_w + l_{b,j}k_b = \pi, \qquad (1)$$

where $l_{w,j}$ and $l_{b,j}$ are the thicknesses, respectively, of the j-th well and barrier of the digitally graded region, and $k_w$ and $k_b$ the wavevector of the electron in the n=3 energy state.

For electrons having relatively low energy, the digitally graded region behaves as a medium with an effective conduction band edge difference $\Delta E_{\mathit{eff}}$, measured with respect to the well (exemplarily GaInAs) conduction band edge, where $$\Delta E_{\mathit{eff},j} = \Delta E_c [l_{b,j}/(l_{b,j}+l_{w,j})]. \qquad (2)$$

In equation 2, $\Delta E_c$ is the conduction band discontinuity between the well and barrier materials. Selecting $\Delta E_{\mathit{eff},j}$ of the j-th well/barrier pair of the digitally graded region such that the conduction band edge of the region is substantially flat under the electric field designed for lasing (which is close to the value required for the "flat band" condition in the graded region), and using equations (1) and (2), one can ensure enhanced electron confinement in the n=3 state while allowing simultaneous transport through the digitally graded region of the electrons that did relax inside the active region.

Whereas a Bragg reflector is an optional feature of QC lasers that have the n=3 and n=2 states associated with different quantum wells, it is considered to be a necessary feature for lasers that have the n=3 and n=2 states associated with one and the same quantum well.

Exemplarily, the active region 11 contains, going from higher to lower layer in the layer sequence, the following sequence of undoped layers: 4.5 nm barrier 110, 0.8 nm well 111, 3.5 nm barrier 112, 3.5 nm well 113, 3.0 nm barrier 114, 2.8 nm well 115, and 3.0 nm barrier 116.

For clarity's sake, FIG. 1 does not show the conduction band edge of digitally graded gap region 12, only the effective band edge 121 associated with the region. The graded gap region exemplarily consist of an AlInAs/GaInAs superlattice with constant period that is shorter than the electron thermal de Broglie wavelength (exemplarily of order 30 nm) in the material, and varying duty cycle to obtain a graded gap pseudoquaternary alloy. See, for instance, F. Capasso et al., *Applied Physics Letters*, Vol. 45(11), p. 1193 (1984). Exemplarily the graded gap region consists of the following n-doped (e.g., $1.5 \times 10^{17}$ cm$^{-3}$Si) layer sequence, arranged to give an effective gap that varies from lower to higher values in going from left to right in FIG. 1: 1.8 nm well/1.2 nm barrier; 1.6/1.4 nm; 1.3/1.7 nm; 1.1/1.9 nm; 0.9/2.1 nm; 0.7/2.3 nm; 0.6 nm well.

As disclosed above, FIG. 1 pertains to the case of a QC laser with digitally graded gap energy relaxation region, and with an applied bias electric field of about $10^5$V/cm, sufficient to provide an electric field that approximately equals the opposing quasi-electric field associated with the conduction band grading, thus resulting in a substantially staircase-shaped conduction band edge. Those skilled in the art will appreciate that, in the absence of an applied bias, the band diagram of the structure has an overall sawtooth shape. See, for instance, Capasso et al., *IEEE Transactions on Electron Devices*, Vol. ED 30(4), p. 381 (1983).

We have carried out calculations which show that, as the depicted substantially "flat band" condition, graded gap energy relaxation regions 12 are quasi-neutral. Electrons relax in the energy relaxation regions and are injected by tunneling into the n=3 excited state (the third energy state).

The tunneling rate through trapezoidal barrier 110 is extremely high, exemplarily about $5ps^{-1}$, ensuring efficient filling of the n=3 level. The electronic states of the $Al_{0.48}In_{0.52}As/Ga_{0.47}In_{0.53}As$ coupled well structure of FIG. 1 were calculated in the envelope function approximation for various electric fields. The material parameters used are: $\Delta E_c$ (conduction band discontinuity)=0.52eV, $m_e^*(GaInAs)=0.043\ m_0$, $m_e^*(AlInAs)=0.078\ m_0$, where $m_0$ is the free electron mass. For the nonparabolicity coefficient we used $Y=1.13\times10^{-18}m^2$. Nonparabolicities were taken into account using the method of D. F. Nelson et al. (op. cit.).

Figure 2:
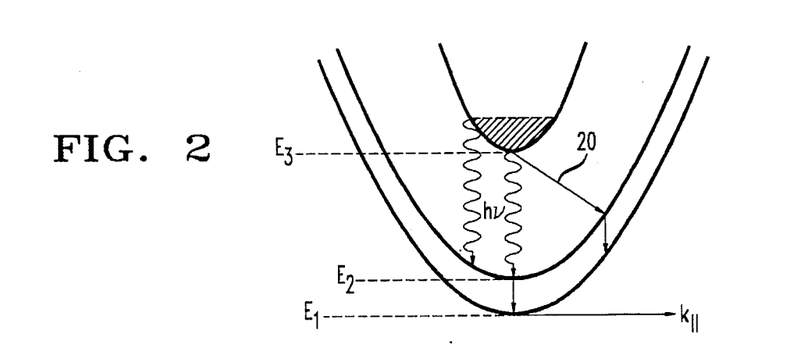
FIG. 2 is a schematic representation of the dispersion of the n=1,2 and 3 energy states, respectively.

FIG. 2 is a schematic representation of the dispersion of the n=1, 2, 3 energy states parallel to the layers of the multilayer structure, with $k_\parallel$ being the corresponding wavevector component. The bottom of the subbands correspond to the first, second and third energy states. The subbands are nearly parallel, due to the small non-parabolicities of $k_\parallel$ not too far (typically $\leq 10$ meV) from the bottom ($k_\parallel = 0$) and for not too large transition energies. As a result, electrons making radiative transitions to a lower subband (e.g., from n=3 to n=2) will all emit photons of essentially the same energy. The joint density of states of these transitions is therefore substantially delta function-like (in the absence of broadening). If a population inversion is created between the n=3 and n=2 states then the gain spectrum of the transition will be correspondingly narrow (collision limited), nearly symmetric, and typically much less sensitive to thermal broadening of the electron distribution than that associated with interband transitions in semiconductor diode lasers. Numeral 20 refers to the optical phonon-assisted transition from the n=3 level to the n=2 level. This process, in structures according to the invention, is between states of reduced wavefunction overlap and is accompanied by a large momentum transfer. Consequently, the relevant relaxation time ($\tau_{32}$) can be relatively long, estimated about 4.3 ps at a bias of $10^5$ V/cm in the above described embodiment. This can ensure population inversion between the n=3 and n=2 states, since the n=2 state empties into the n=1 state with a relaxation time estimated to be about 0.6 ps. This efficient relaxation is provided by quantum well 115. Strong inelastic relaxation via optical phonons with nearly zero momentum transfer occurs between strongly overlapped and closely spaced n=2 and n=1 subbands, as shown in FIG. 2. Finally, the tunneling escape time out of the n=1 state into the adjoining energy relaxation region typically is extremely short, exemplarily less than about 0.5 ps. This further facilitates population inversion.

The above described structure also facilitates injection into the excited state $E_3$ by reducing the tunneling escape probability into the continuum. The estimated escape time $\tau_{esc}$ is 6 ps, which leads to an injection efficiency $\eta_{in}=\tau_{esc}/(\tau_{esc}+\tau_{32})\cong 0.6$. The radiative efficiency of the n=3 to n=2 laser transition is estimated to be $\tau_{32}/\tau_R \approx 3\times10^{-4}$ at a filed $\sim 10^5$ V/cm, where $\tau_R$ is the spontaneous emission lifetime, estimated to be about 13 ns. Calculations show that the product of $|Z_{32}|^2\tau_{32}$ (where $Z_{32}=1.5$ nm is the n=3 to n=2 transition matrix element) is weakly dependent on the electric field. The low or substantially zero doping level in the active region strongly reduces the linewidth of the n=3 to n=2 electroluminescence, as compared to more highly doped coupled wells, thus enhancing the peak material gain for the same radiative efficiency. Electric field tunable electroluminescence, up to room temperature, has recently been observed by us in similar AlInAs/GaInAs coupled-quantum-well heterostructures.

We have incorporated a multiplicity of the above described active region/energy relaxation region units into a waveguide structure. The resulting unipolar device lased at a wavelength of about 4.2 μm. To the best of our knowledge, this is the first observation of laser action in a unipolar quantum well semiconductor structure.

Figure 7:
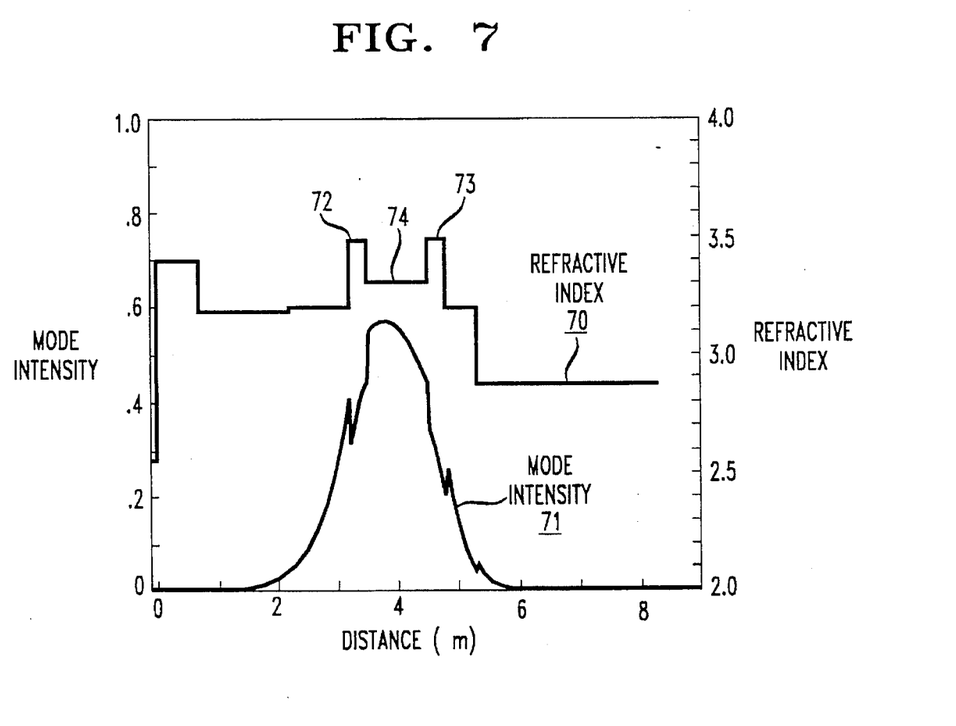
FIG. 7 shows refractive index profile and mode intensity of an exemplary QC laser.

Table 1 shows the layer sequence of an exemplary laser according to the invention. The 33.2 nm digitally graded region corresponds to below-defined "digital grating II", followed by below-defined "digital grating I", with the latter being above the former in the sequence of Table 1. The active region/digitally graded energy relaxation region sequence was repeated 25 times. Each unit of the sequence consisted of an undoped active region (3.0 nm barrier/2.8 nm well; 3.5 nm/3.5 nm; 3.5 nm 0.8 nm; 4.5 nm barrier) and one n-type ($1.5\times10^{17}$ cm$^{-3}$) "digital grating II". The 3.0 nm barrier corresponds to layer 110 of FIG. 1 and is, under a normal operating voltage, the most "upstream" layer of a given active region 11. The 14.6 nm digitally graded region corresponds to "digital grating I", and the 18.6 nm digitally graded region corresponds to "digital grating II". The compositions of the core and cladding regions were selected such that, at the lasing wavelength, the effective refractive index of the core region is larger than the effective indices of both the lower and upper cladding regions. The refractive index profile 70 of the layer structure is shown in FIG. 7, together with the calculated intensity profile 71 of the lasing mode. The confinement factor of the mode was calculated to be 0.496. A significant aspect of the waveguide structure that corresponds to the refractive index profile of FIG. 7 is the presence of doped ($10^{17}$cm$^{-3}$) 300 nm GaInAs layers that correspond to refractive index regions 72 and 73, which sandwich the active region that corresponds to refractive index region 74 and which significantly enhance mode confinement by providing large refractive index steps. Those skilled in the art will appreciate that such enhancement layers are novel, being unsuitable for use in conventional diode lasers since they would introduce unacceptable loss due to interband absorption. The entire multilayer structure was grown epitaxially, by MBE, on a conventional n$^+$-dope InP wafer.

TABLE 1

|   |   | n-doping level (cm$^{-3}$) | Thickness (nm) |
|---|---|---|---|
| ↑ | GaInAs | $2.0 \times 10^{20}$ | 20.0 |
| Contact | Sn doped | | |
| layer | GaInAs | $1.0 \times 10^{18}$ | 670.0 |
|   | AlGaInAs | $1.0 \times 10^{18}$ | 30.0 |
| ↓ | Graded | | |
| ↑ | | | |
| Waveguide | AlInAs | $5.0 \times 10^{17}$ | 1500.0 |
| cladding | AlInAs | $1.5 \times 10^{17}$ | 1000.0 |
| ↓ | | | |
| ↑ | AlGaInAs | $1.5 \times 10^{17}$ | 18.6 |
|   | Digitally graded | | |
|   | Active region | undoped | 21.1 |
|   | GaInAs | $1.0 \times 10^{17}$ | 300.0 |
| Waveguide | AlGaInAs | $1.5 \times 10^{17}$ | 14.6 |
| core | Digitally graded | | |
|   | AlGaInAs | $1.5 \times 10^{17}$ | 18.6 ↑ |
|   | Digitally graded | | ×25 |
|   | Active region | undoped | 21.1 ↓ |
|   | GaInAs | $1.0 \times 10^{17}$ | 300.0 |
|   | AlGaInAs | $1.5 \times 10^{17}$ | 33.2 |
| ↓ | Digitally graded | | |
| ↑ | AlInAs | $1.5 \times 10^{17}$ | 500.0 |
| Waveguide | Doped n$^+$InP substrate | | |
| cladding | | | |

TABLE II

Digital Grating I

| | |
|---|---|
| AlInAs | 1.2 nm |
| GaInAs | 6.5 nm |
| AlInAs | 1.2 nm |
| GaInAs | 4.5 nm |
| AlInAs | 1.2 nm |

TABLE III

Digital Grating II

| | |
|---|---|
| GaInAs | 1.8 nm |
| AlInAs | 1.2 nm |
| GaInAs | 1.6 nm |
| AlInAs | 1.4 nm |
| GaInAs | 1.3 nm |
| AlInAs | 1.7 nm |
| GaInAs | 1.1 nm |
| AlInAs | 1.9 nm |
| GaInAs | 0.9 nm |
| AlInAs | 2.1 nm |
| GaInAs | 0.7 nm |
| AlInAs | 2.3 nm |
| GaInAs | 0.6 nm |

The thus produced multilayer wafer was conventionally lithographically processed into mesa etched ridge waveguides of width 12 μm. The length of the waveguides (varying from 0.5 to 2.8 mm) was defined by cleaving. This also was conventional. The cleaved facets provided the reflection means that define the laser cavity. Facet reflectivity was about 0.27. Conventional ohmic contacts were provided to the top contact layer and to the substrate. An exemplary device, of length 500 μm, was soldered to a ceramic holder, mounted in a conventional flow dewar and tested by injection of 20 ns current pulses ($10^{-3}$ duty cycle) and measurement of the emission spectrum by conventional means (Nicolet Fourier transform IR spectrometer).

Figure 10:
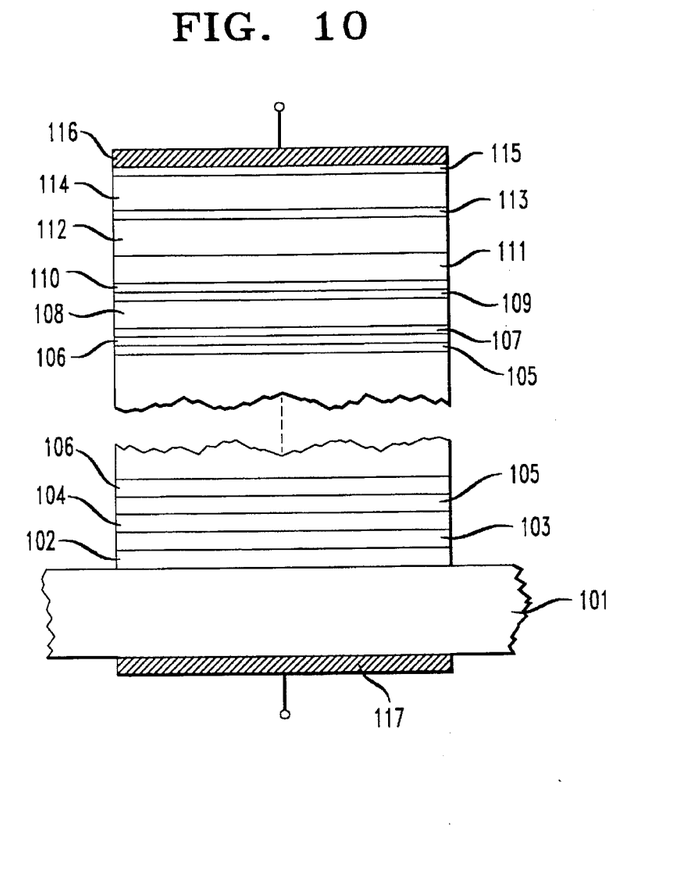
FIG. 10 schematically depicts an exemplary QC laser.

FIG. 10 schematically depicts the above described exemplary laser according to the invention. Numerals 101–104 refer to the substrate, 500 nm AlInAs layer, 33.2 nm digitally graded layer, and 300 nm GaInAs layer, respectively. The digitally graded layer 103 consists of digital grating I above digital grating II. Numerals 105 and 106 refer to the active region and the 18.6 nm digitally graded layer (digital grating II), respectively. Layers 105 and 106 are repeated several (e.g., 25) times. Numerals 107–110 refer to the 14.6 nm digitally graded (digital grating I) layer, the second 300 nm GaInAs layer, the further 21.1 nm active region, and the further 18.6 nm digitally graded (digital grating II) layer, respectively. Numerals. 111–115 refer to the 1000 nm cladding layer, the 1500 nm cladding layer, the 30 nm graded contact layer, the 670 nm GaInAs contact layer, and the 20 nm highly doped ($2\times10^{20}$ cm$^{-3}$) GaInAs contact layer, respectively. Numerals 116 and 117 refer to conventional metal contact layers. Those skilled in the art will appreciate that FIG. 10 is schematical, with some conventional features (e.g., re-growth) not shown, and that layer thicknesses and other dimensions are not drawn to scale or in proportion.

Figure 3:
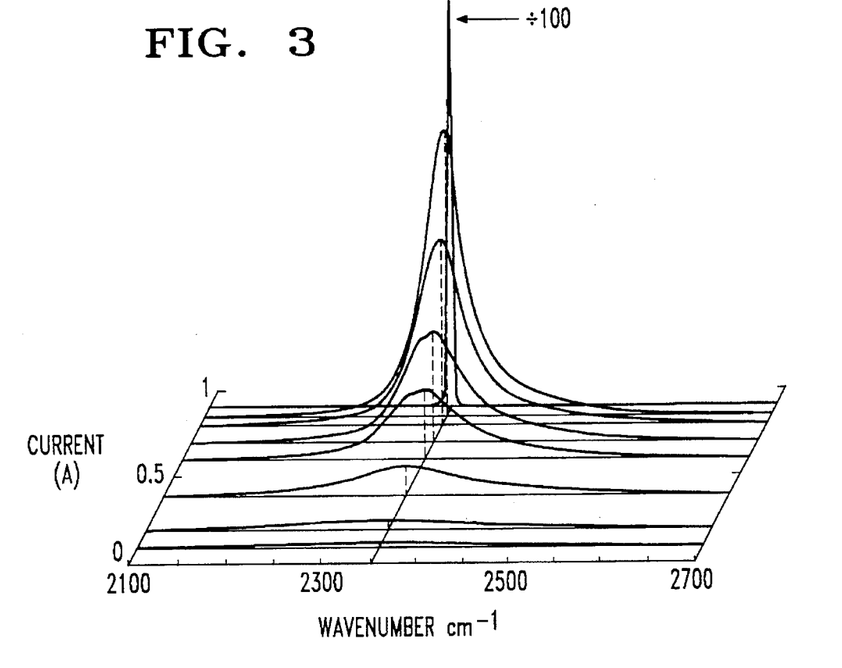
FIG. 3 shows exemplary data on the emission spectrum of a laser according to the invention, for various drive currents.

FIG. 3 shows exemplary results at 10K. Above a device current of about 850 mA, corresponding to a threshold current density of about 15 kA/cm$^2$, the signal amplitude increases abruptly by orders of magnitude, accompanied by dramatic line-narrowing. This is direct manifestation of laser action. In other QC lasers we have observed lasing at liquid nitrogen temperature, with powers approaching 20 mW for a 1.2 mm long cavity under pulsed operation. Lasing temperatures as high as 125K have been attained. Design and packaging optimization is expected to result in QC lasers capable of CW operation at even higher temperatures.

Figure 4:
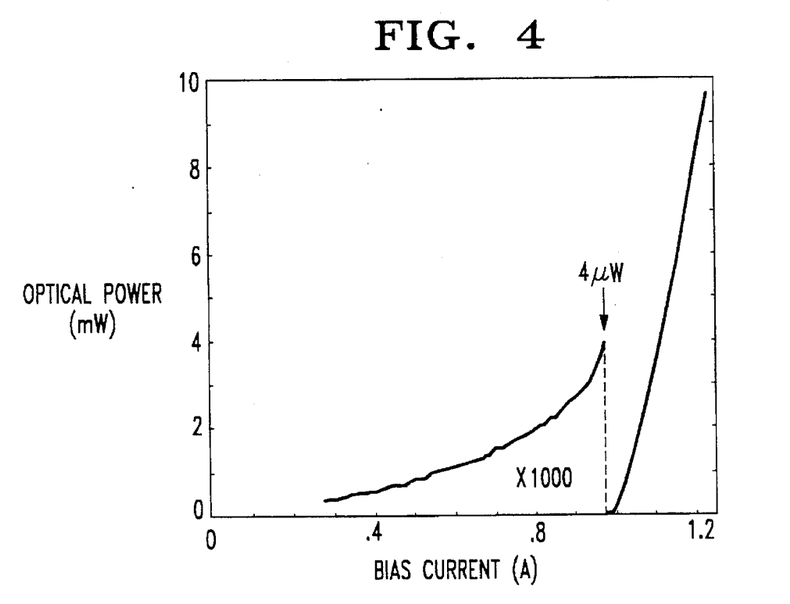
FIG. 4 provides data on optical power vs. drive current for another exemplary laser according to the spectrum.
Figure 5:
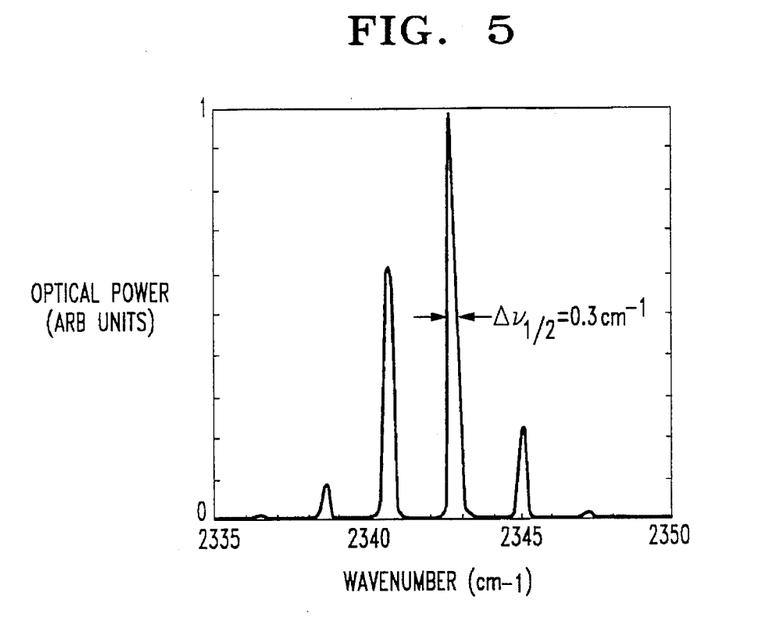
FIG. 5 shows a portion of the spectrum of FIG. 3 in high resolution.

FIG. 4 shows optical power vs. device current at 10K for a laser substantially as described, but of length 720 μm. The threshold current density is 11 kA/cm$^2$, corresponding to 8.7 V across the device, with peak optical power from a single facet of about 8.5 mW. This power was limited by the collection efficiency (40%) of the apparatus and by the divergence of the beam (±40°) normal to the layers. FIG. 5 shows a portion of the spectrum at higher resolution. Well defined, nearly equally spaced ($\Delta\upsilon=2.175$ cm$^{-1}$) longitudinal modes were observed. The linewidth of the dominant mode was about 0.3 cm$^{-1}$, presently limited by heating effects and mode hopping during the pulse. Theory predicts, for single longitudinal mode continuous wave (cw) operation, a Schawlow-Townes linewidth with negligible linewidth enhancement factor, compared to conventional semiconductor lasers.

The laser wavelength essentially does not shift in the current range of FIG. 4, indicating that the electron density in the n=3 state is locked at the threshold value. Using measured results and estimated values of $\tau_{32}$ and $\tau_{esc}$ ($\tau_{esc}$ is the escape time from the n=3 state into the continuum), we estimate a population inversion $n_s=1.7\times10^{11}$ cm$^{-2}$, comparable to the electron density in the graded gap region.

In other experiments, we obtained from a 1.2 mm long laser an output power of 30 mW at 10K and 4 mW at 125K, and from a 2.8 mm long laser a power of 130 mW at 10K.

Figure 6:
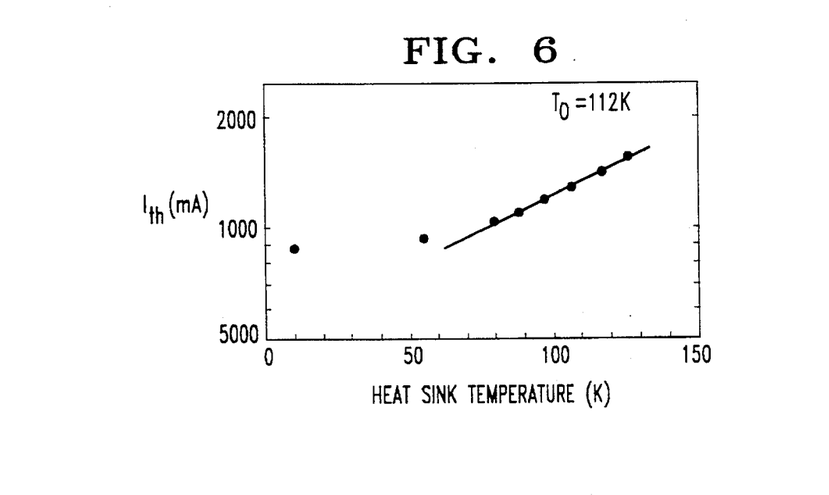
FIG. 6 shows data on threshold current vs. laser temperature for a still further laser according to the invention, indicating a value of 112K for the laser parameter $T_o$.

FIG. 6 shows data on the temperature dependence of the threshold current of a 1.2 mm QC laser. The data shows that the conventional laser parameter $T_o$ had the value 112K, indicative of desirably low temperature dependence of the threshold. The observed lasing mode was polarized normal to the layers of the multilayer structure, due to the selection rule for intersubband transitions.

Digital grading of the energy relaxation regions is not required, and conventional (continuous or discontinuous) "analog" grading is contemplated. Indeed, the energy relaxation region need not be a graded gap region, and all other means for attaining carrier energy relaxation in the region between adjacent active regions are contemplated. Exemplary of such other means are a doped, relatively thick, uniform quantum well, and a superlattice region.

The former exemplarily is doped to a level of order $10^{17}$/cm$^3$, and has a thickness (e.g., 1–2$\lambda_E$) selected to result in energy relaxation of the carriers to the bottom of the band in the region. Desirably, the composition of the quantum well (e.g., Al$_x$Ga$_{1-x}$As) is selected such that, under the bias required for lasing, the conduction band edge in the well is essentially lined up with the n=3 energy state of the adjacent (downstream) active region.

Figure 8:
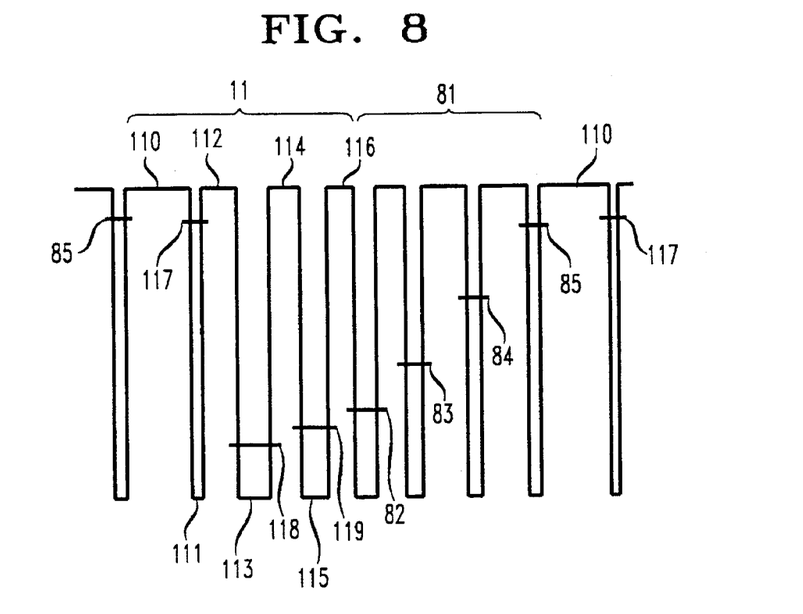
FIGS. 8 and 9 schematically illustrate an exemplary superlattice energy relaxation region.
Figure 9:
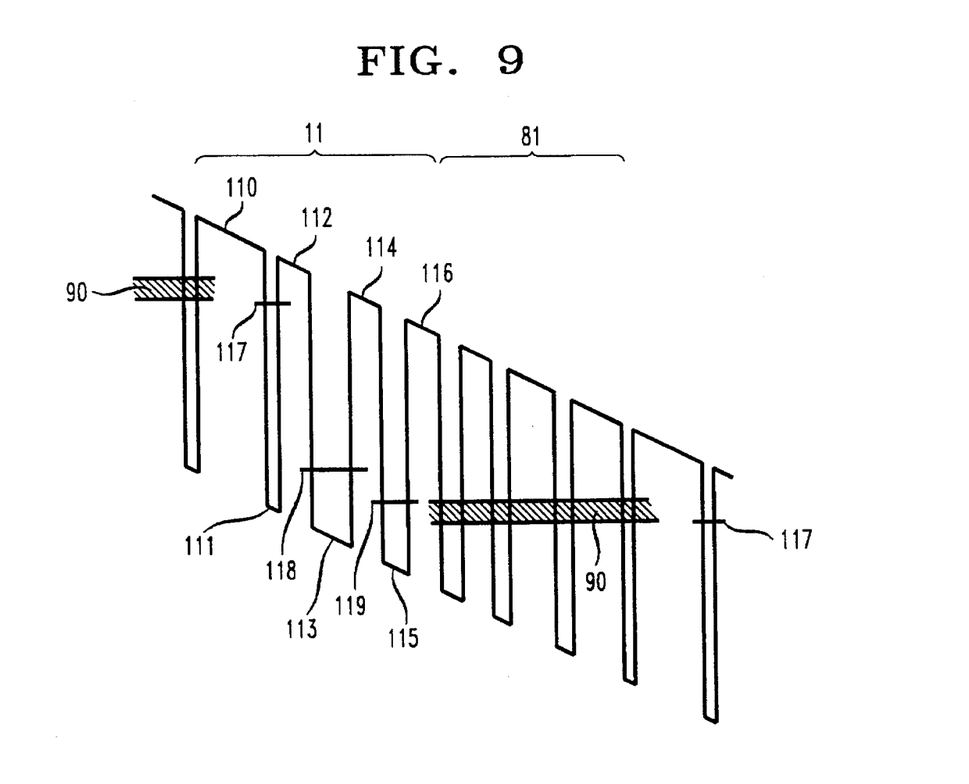

FIGS. 8 and 9 illustrate the design of an exemplary superlattice energy relaxation region, with the former showing the relevant aspects of the band structure under zero bias and the latter showing the aspects under lasing bias. Active region 11 is essentially the same as the active region of FIG. 1, and numeral 81 designates the superlattice energy relaxation region, with numerals 82–85 designating energy states. The quantum wells of the superlattice are selected such that, upon application of the lasing bias, energy states 82–85 become substantially aligned, forming miniband 90, with the miniband desirably positioned such that carriers from first energy state 119 can readily enter the miniband, and carriers can readily enter third energy state 117 of the adjacent (downstream) active region.

Still furthermore, the unipolar laser need not be n-doped but can, at least in principle, be p-doped, with the carriers preferably being the light holes to facilitate tunneling in appropriately strained layer semiconductors such as $In_xGa_{1-x}As$.

QC lasers can be implemented by conventional techniques (exemplary comprising MBE) in a variety of semiconductor systems. Exemplarily of such systems are AlGaAs/InAs, InP/GaInAs, and AlInAs/GaInAs, where the first member of a pair is the barrier material, and the second member is the well material.

Quantum well structures similar to those described above (but differing therefrom inter alia with respect to doping of the active region, and lacking a waveguide structure) were recently described in the literature. J. Faist et al., *Electronics Letters*, Vol. 29 (25), p. 2230 (Dec. 1993), and J. Faist et al., *Applied Physics Letters*, Vol. 64, p. 1144, (1994), both incorporated herein by reference. These papers disclose observation of luminescence, but do not report observation of lasing. Indeed, the structures disclosed in these papers were not designed, and were unsuitable, for laser action.

Unipolar lasers have the unique property that carriers in the active region form a unipolar plasma. We have discovered that the spatial position of such a plasma can be controlled by means of an appropriate electric field, to be designated the "control" field. The ability to control the spatial position of the plasma in the laser structure makes possible, for instance, controlled steering of the laser output beam, and external control of the modal gain of the laser, i.e., control of the overlap of the optical wave cross section with the spatial profile of the gain.

In general, the electric control field will be applied such that at least a component of the control field lies in the plane of the layer structure (that is to say, in a plane normal to the direction of current flow in the layer structure). For instance, the control field can be applied in the direction perpendicular to the axis of the laser cavity by one or more sets of parallel planar conductors, possibly but not necessarily, integrated with the laser structure. Exemplarily, the planar conductors are metallic layers deposited over the sidewall dielectric.

Another contemplated approach to the application of the control field utilizes the piezo-electric property of the laser material, especially if the QC laser is implemented in III-V heterostructure materials. For instance, generation of an acoustic wave (either as a traveling or a standing wave) can result in a spatially varying electric field in the material, and thus can result in an acoustoelectric interaction between the acoustic wave and the carriers. For instance, an acoustic wave, propagating in the direction parallel to the axis of the laser cavity, can establish a periodic structure in the density of carriers (which, in turn, leads to periodic spatial structure in the optical gain and the refractive index) which can, for instance, serve as a "grating" for distributed feedback. This effect, for instance, makes it possible to vary the frequency of the lasing mode by varying the frequency of the acoustic wave.

Those skilled in the art will appreciate that the piezo-electrically generated control field need not be due to an acoustic wave but can be generated by other means, e.g., by application of static or time-varying stress.

We will now discuss our surprising discovery that a QC laser does not necessarily require two (or more) coupled QWs in each active region but that lasing can be achieved in a QC laser having only one QW in each active region.

In the above discussed multi-QW QC lasers the relaxation times are selected such that "global" (i.e., integrated over all electron wave numbers) population inversion obtains. We have discovered that attainment of global population inversion is not a necessary condition for lasing, and that laser action, with reasonable threshold, can take place if local population inversion in a small region of k-space near k=0 obtains. The referred-to small region of k-space typically corresponds to electron energies within an optical phonon energy (exemplarily about 35 meV) from the bottom of the lower subband. As will be seen, local population inversion is relatively easily achieved.

Figure 11:
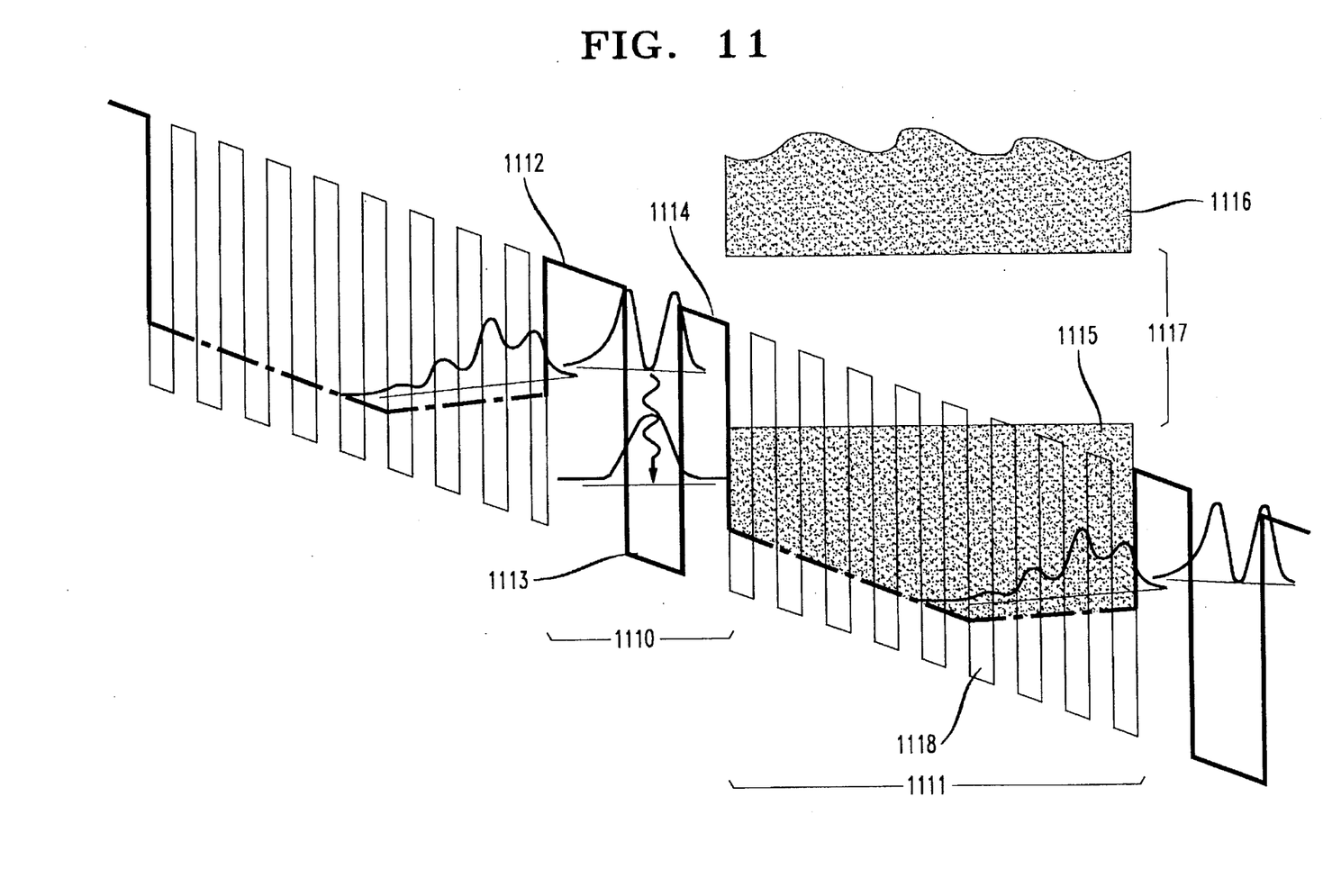
FIG. 11 schematically depicts a portion of the conduction band diagram of an exemplary single QW laser according to the invention.

FIG. 11 schematically shows a portion of the conduction band structure of a single QW laser according to the invention under positive bias (75 kV/cm). Numerals 1110 and 1111 refer to the active region and the associated Bragg reflector (carrier injector/relaxation) region, respectively, and 1112, 1113 and 1114 refer to first barrier, QW and second barrier, respectively. Shown are also the lower (n=1) and upper (n=2) energy states in the QW, with the respective associated wave functions (moduli squared). The energy difference between the two energy states is 280 meV. The dashed-dotted lines are the effective conduction band edges of the superlattice graded gap electron injector/relaxation regions. Region 1115 represents the energy range and spatial extension of band-like electron states, and is referred to as a "miniband". It is separated from upper miniband 1116 by "minigap" 1117 that substantially blocks electron escape from the upper energy level of the QW. It will be understood that the Bragg reflector superlattice region 1111 is designed to result in the minibands and minigap, substantially as described above. The wavy arrow indicates the transition that is responsible for laser action.

In an exemplary embodiment of the single QW QC laser, the following $Al_{0.48}In_{0.52}As/Ga_{0.47}In_{0.53}As$ layer sequence (starting with injection barrier layer 1112 and going from left to right in FIG. 11; thicknesses in nm) was provided: (6.8/4.8), (3.5/2.3), (1.9/2.2), (2.2/2.1), (2.1/2.0), (2.0/1.8), (1.8/1.7), (2.0/1.6), (2.2/1.6), and (2.4/1.4). The layer sequence was not intentionally doped, with the exception of the 14th through 20th layers, which were doped n-type to about $3 \times 10^{17} cm^3$. The twelfth layer is identified by numeral 1118.

The laser structure comprises 25 layer sequences as described. For the lower cladding region of the laser waveguide the n-type InP substrate ($\sim 1-2 \times 10^{18} cm^{-3}$) was used. This results in improved thermal characteristics of the laser, and is considered to be a widely applicable new laser design feature, as will now be discussed.

Because of alloy scattering, ternary III/V materials have a thermal resistance that is 15–20 times larger than that of such binary III/V materials as InP or GaAs. For this reason, and to bring the active region of a semiconductor laser closer to the (typically binary) substrate, it is desirable to reduce the thickness of ternary (and/or quaternary) cladding material between the active region and the substrate. Clearly, the absence or substantial reduction of ternary cladding material between the active region and the substrate results in reduced thermal resistance between the active region and the substrate, and consequently in improved thermal characteristics of the laser. We have used this design feature also with multi-QW QC lasers, and believe that it significantly contributed to the attainment of CW operation in these lasers. The feature thus is advantageously used in all types of QC lasers. It will be understood that "substrate" may include a binary III/V buffer layer on the binary bulk III/V material.

For the upper cladding region of the exemplary single QW QC laser three AlInAs regions of thickness 700, 600 and 1200 nm, with n-type doping of $1.2 \times 10^{17}$, $3 \times 10^{17}$ and $7 \times 10^{18} cm^{-3}$, respectively, were grown in sequence. Between the waveguide core and the cladding layers were provided 200 nm thick InAs layers, doped n-type to about $1.5 \times 10^7 \text{cm}^{-3}$, with suitable ~10 nm thick interface-smoothing AlInGaAs compositionally graded layers. A top 10 nm thick contact layer (Sn doped to $10^{20} \text{cm}^{-3}$), separated from the AlInAs cladding by a 30 nm thick $n^+$ AlInGaAs graded layer, completed the growth of the exemplary laser structure.

A comparison structure was also grown. Each of the 25 identical active region/Bragg reflector layer sequences of the comparison structure was identical to those of the above described inventive structure, except that the active region contained two QWs, not one. Specifically, the layer sequence of the active region of the comparison structure had the following thicknesses in nm: (6.8/4.8), (2.8/3.9) and (2.7/2.2). All other layers were as described above.

Figure 12:
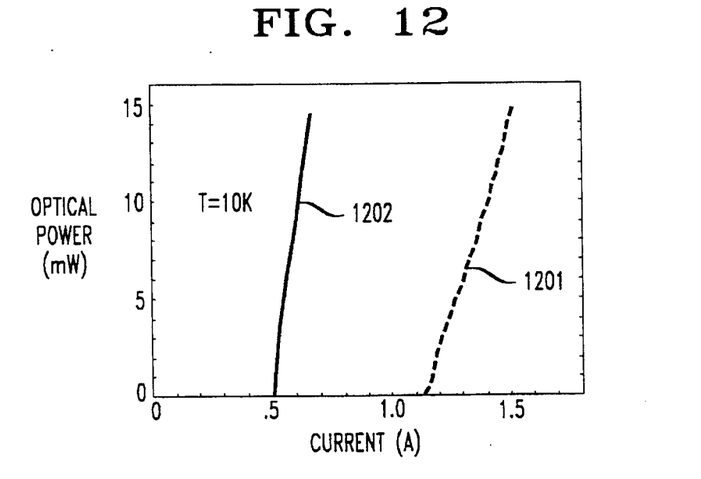
FIG. 12 shows exemplary data on optical power vs. pump current.

Both structures were processed into 2.25 mm long cleaved ridge waveguides of width 11 μm. Current pulses of 50 ns duration were then injected into the devices at 20 kHz repetition rate. FIG. 12 shows peak optical power vs. drive current at 10K of the exemplary single QW QC laser (numeral 1201), and of the comparison (2 QW) QC laser (numeral 1202).

Figure 13:
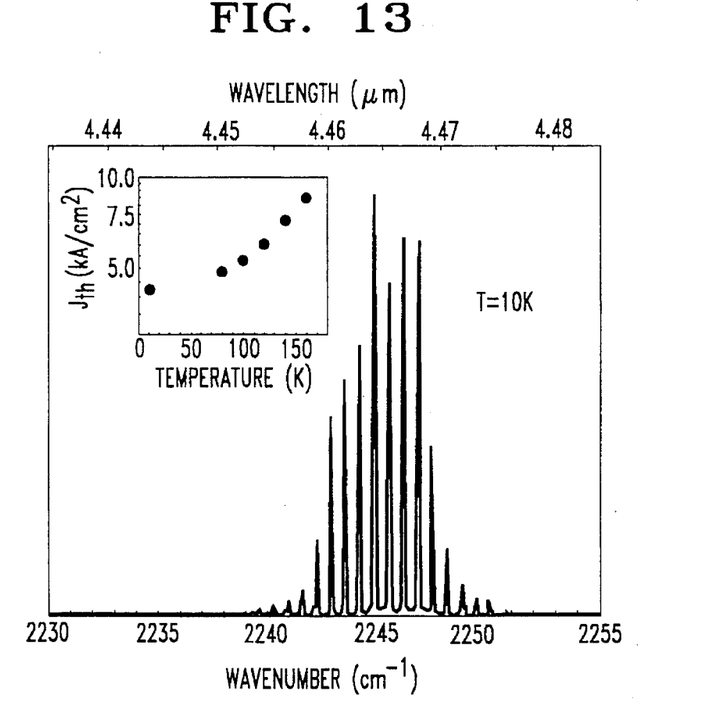
FIG. 13 shows exemplary spectroscopic and thermal data.

FIG. 13 shows the output spectrum above threshold of the single QW QC laser according to the invention. The inset shows the temperature dependence of the threshold current of the inventive laser.

Laser operation of single QW QC lasers will now be discussed with reference to FIG. 14. This discussion is based on our current understanding. It is included for tutorial purposes only, and is not intended to limit the scope of the invention.

Figure 14:
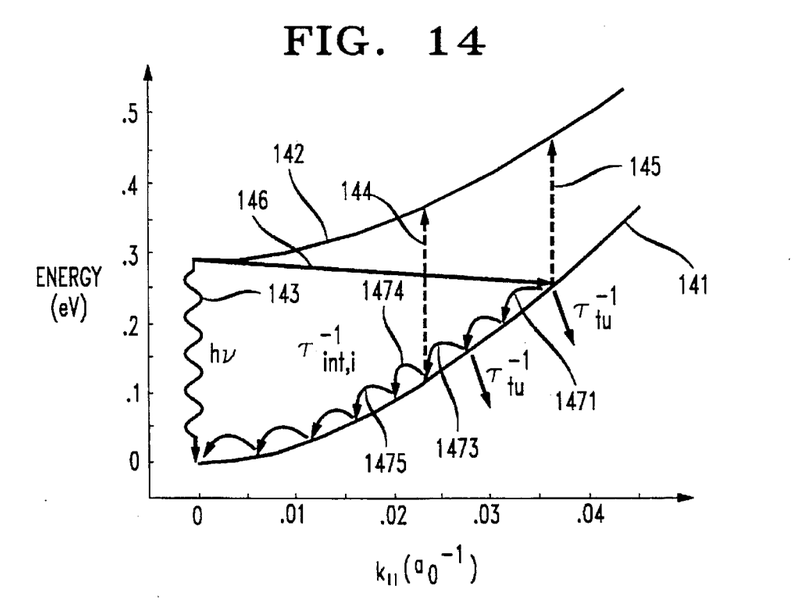
FIG. 14 shows the calculated dispersion of the two subbands of an exemplary single QW QC laser.

Lasing in the single QW QC laser is made possible by non-parabolicity of the energy bands, as shown in the energy dispersion relation depicted in FIG. 14, wherein numerals 141 and 142 refer to the energy as a function of momentum parallel to the plane of the QW for, respectively, the n=1 and n=2 states. These non-parabolicities manifest themselves in the different curvature (i.e., different effective mass) of the two states. As a result of this difference in curvature, only electrons that are in a small region of k-space (of width≦optical phonon energy, e.g., about 35 meV) near k=0 can absorb photons of energy equal to hυ (i.e., the energy difference between the two states at k=0), where υ is the lasing frequency, and h is Planck's constant. The lasing transition is schematically indicated by wavy arrow 143, and dotted arrows 144 and 145 indicate exemplary transitions that can not be excited by the photons of energy hυ because the relevant energies differ significantly from hυ.

In FIG. 14, arrows 146, 1471, 1472 ... 147N indicate a possible sequence of non-radiative transitions that can result in the transfer of an electron from the n=2 (k~0) state to the n=1 (k~0) state. Arrow 146 refers to an inter-subband transition that involves emission of an optical phonon, and arrows 1471–147N refer to intra-subband transitions that also involve emission of optical phonons. The electrons in the n=1, $k_\parallel > 0$ states can tunnel out of the QW at a rate $\tau_{tu}^{-1}$, and undergo optical phonon scattering at rates $\tau_{int,i}^{-1}$, where i=1,2 ... N.

Those skilled in the art will recognize that it is necessary that the fraction of electrons in the relevant region near k=0 in the n=1 state is substantially less than 1. Our calculations indicate that this fraction is about ½ for the above described single QW QC laser.

Those skilled in the art will also recognize that the above described technique of control of the spatial position of the plasma in the unipolar QC laser by means of a control field applies to single QW QC lasers as well as to multi QW QC lasers, and application of the technique to the former is contemplated.

The invention claimed is:

1. An article comprising a unipolar semiconductor laser, said laser comprising a) a multilayer semiconductor structure that comprises doped semiconductor material of only a first conductivity type; and b) means for applying a voltage across said multilayer semiconductor structure;

CHARACTERIZED IN THAT c) said multilayer structure comprises a multiplicity of essentially identical active regions, a given of said active regions being separated from an adjoining active region by a superlattice carrier injection/relaxation region;

d) the given active region comprises a single quantum well, associated with said quantum well are a first and a second energy state for charge carriers of the first conductivity type, with said second energy state being higher in energy than said first energy state;

e) said superlattice carrier injection/relaxation region is selected to be relatively transmissive for carriers in the first energy state, and to be substantially less transmissive for carriers in the second energy state; and f) at least some of the charge carriers of the first conductivity type undergo a radiative transition from the second to the first energy state.

2. Article according to claim 1, wherein the active region is substantially undoped, and the energy relaxation region comprises doped semiconductor material.

3. Article according to claim 1, wherein the energy relaxation region comprises alternating layers of a first and a second semiconductor material.

4. Article according to claim 3, wherein the energy relaxation region comprises a doped superlattice region that comprises a multiplicity of quantum wells.

5. Article according to claim 1, wherein said multilayer semiconductor structure is selected to provide a waveguide for photons of energy corresponding to said radiative transition.

6. Article according to claim 5, wherein said waveguide comprises a core that comprises said active region, said core being disposed on a doped binary III/V semiconductor substrate, and further comprises an upper cladding region that comprises doped ternary or quaternary III/V semiconductor material.

7. Article according to claim 1, further comprising means for applying a control field to the laser such that at least a component of said control field lies in the plane of the layers of the multilayer structure.

8. An article comprising a unipolar semiconductor laser comprising a) a multilayer semiconductor structure on a substrate;

b) contacts for applying a voltage across the multilayer semiconductor structure; wherein c) said multilayer semiconductor structure comprises a multiplicity of essentially identical active regions, a given of said active regions being separated from an adjoining active region by a superlattice carrier injection/relaxation region, with the given region containing one or more quantum wells;

d) the multilayer semiconductor structure is selected to provide a waveguide for a laser radiation, said waveguide comprising a core that comprises said active region, and further comprise an upper cladding region and a lower cladding region, said core being disposed between said upper and lower cladding regions, the lower cladding region comprising the substrate, where the substrate is a doped binary III/V semiconductor substrate.

9. Article according to claim 8, wherein a given of said active regions comprises two or more quantum wells.

10. Article according to claim 8, wherein the upper cladding region comprises doped ternary or quaternary III/V semiconductor material.

* * * * *